(12) United States Patent
Yeo

(10) Patent No.: US 6,281,085 B1
(45) Date of Patent: Aug. 28, 2001

(54) METHOD OF MANUFACTURING A SEMICONDUCTOR DEVICE

(75) Inventor: In Seok Yeo, Kyungki-Do (KR)

(73) Assignee: Hyundai Electronics Industries Co., Ltd., Kyungki-do (KR)

( * ) Notice: Subject to any disclaimer, the term of this patent is extended or adjusted under 35 U.S.C. 154(b) by 0 days.

(21) Appl. No.: 09/605,634

(22) Filed: Jun. 28, 2000

(30) Foreign Application Priority Data

Jun. 28, 1999 (KR) .................................................. 99-24895

(51) Int. Cl.[7] .................................................. H01L 21/336
(52) U.S. Cl. .......................... 438/303; 438/301; 438/306; 257/408
(58) Field of Search .......................... 438/300, 301–303, 438/304, 315, 306; 258/408

(56) References Cited

U.S. PATENT DOCUMENTS

| | | | |
|---|---|---|---|
| 4,728,623 | 3/1988 | Lu et al. | 437/52 |
| 4,738,937 | 4/1988 | Parsons | 437/180 |
| 4,918,029 | 4/1990 | Kim | 437/119 |
| 5,004,702 | 4/1991 | Samata et al. | 437/57 |
| 5,032,538 | 7/1991 | Bozler et al. | 437/83 |
| 5,045,494 | 9/1991 | Choi et al. | 437/60 |
| 5,272,109 | 12/1993 | Motoda | 437/129 |
| 5,322,802 | 6/1994 | Baliga et al. | 437/22 |
| 5,322,814 | 6/1994 | Rouse et al. | 437/110 |
| 5,352,631 * | 10/1994 | Sitaram et al. | |
| 5,378,652 | 1/1995 | Samata et al. | 437/189 |
| 5,432,121 | 7/1995 | Chan et al. | 437/95 |
| 5,435,856 | 7/1995 | Rouse et al. | 136/225 |
| 5,494,837 | 2/1996 | Subramanian et al. | 437/34 |
| 5,496,750 * | 3/1996 | Moslehi . | |
| 5,508,225 | 4/1996 | Kadoiwa | 437/129 |
| 5,567,652 | 10/1996 | Nishio | 437/200 |
| 5,599,724 | 2/1997 | Yoshida | 437/40 |
| 5,627,102 | 5/1997 | Shinriki et al. | 437/192 |
| 5,633,201 | 5/1997 | Choi | 438/620 |
| 5,744,377 | 4/1998 | Sekiguchi et al. | 438/674 |
| 5,773,350 | 6/1998 | Herbert et al. | 438/364 |
| 5,804,470 | 9/1998 | Wollesen | 438/141 |
| 6,177,323 * | 1/2001 | Wu | 438/300 |

FOREIGN PATENT DOCUMENTS

| | | |
|---|---|---|
| 54-158880 | 12/1979 | (JP) . |
| 2-37745 | 2/1990 | (JP) . |
| 2-260667 | 10/1990 | (JP) . |
| 8-236728 | 9/1996 | (JP) . |
| 10-107219 | 4/1998 | (JP) . |
| 11-97519 | 4/1999 | (JP) . |

* cited by examiner

Primary Examiner—Long Pham
(74) Attorney, Agent, or Firm—Pennie & Edmonds LLP

(57) ABSTRACT

There is disclosed a method of manufacturing a semiconductor device capable of solving the problems that a conventional method could not secure a sufficient beam current upon ion injection when forming a junction region at shallow thickness as the integration level of'devices becomes higher, and also it causes a short channel effect etc.

The method includes forming a junction region, forming a selective epitaxial growth layer and then forming a LDD region, using a facet phenomenon occurring at the edge portion of the gate electrode when forming an elevated junction structure by use of a selective epitaxial growth method. Thus, it can obtain a junction region having a very shallow depth, accomplish a higher integration level of devices and prohibit a short channel effect.

12 Claims, 1 Drawing Sheet

METHOD OF MANUFACTURING A SEMICONDUCTOR DEVICE

BACKGROUND OF THE INVENTION

1. Field of the Invention

The invention relates generally to a method of manufacturing a semiconductor device, and more particularly to, a method of manufacturing a semiconductor device in which a facet phenomenon generated by a selective epitaxial growth (called SEG hereinafter) used in forming a Lightly Doped Drain (LDD) structure and an elevated source/drain structure of a semiconductor device is used, thus obtaining a junction region having a very shallow depth.

2. Description of the Prior Art

As a semiconductor device is highly integrated, the depth of a device junction becomes also shallow. Thus, in order to shallow the depth of the junction region, a method of lowering the amount of the energy when ion injection process is applied, is used. However, this method has the following problems that it could not obtain a sufficient beam current upon ion injection and it will increase the possibility of channeling in a low ion injection energy etc.

In order to solve these problems, a SEG method has been proposed, by which a gate electrode is formed on a semiconductor substrate and then a silicon layer is selectively formed only on source and drain regions so as to increase the height of the source and drain regions.

FIG. 1 is a sectional view of a device for illustrating a method of manufacturing a conventional semiconductor device.

First a semiconductor device 11 is thermally oxidized to form a gate oxide film 12. Then a conductive layer 13 for use in a gate electrode and a first insulating film 14 are sequentially formed on the entire structure. Thereafter, a portion in which the gate electrode will be formed is defined by photolithography process and etching process. Then the first insulating film 14 and the conductive layer 13 are sequentially removed to form a gate electrode. Next, a LDD region 16 is formed by means of ion injection process using a low concentration impurity. Then, after forming a second insulating film 15 on the entire structure a blanket etching is performed to form spacers on both sides of the gate electrode. Thereafter, in order to form an elevated source/drain structure, a SEG process is performed to form a SEG layer 17. Finally, a high concentration ion injection process is performed to form a junction region 18.

In case of the method of forming a LDD structure of a semiconductor device as explained above as SEG process is performed after ion injection process for forming the LDD region 16 is performed, it could not solve the above mentioned problems that it could not obtain a sufficient beam current upon ion injection process and that it may increase the possibility of channeling in a low energy. Further, due to inherent SEG process, there are problems that a facet phenomenon (marked A) is occurred at the edge portion of the gate electrode and that the depth of junction is partially deepened (marked 13) at the place (marked A) where the facet phenomenon was occurred upon ion injection process for forming a subsequent junction regions 18. As the facet phenomenon occurs at the edge portion of the gate electrode, it is difficult to form a LDD structure in which the junction depth at the edge portion of the gate electrode is shallow and that at the other region of the gate electrode is deep.

SUMMARY OF THE INVENTION

It is therefore an object of the present invention to provide a method of manufacturing a semiconductor device in which, after a gate electrode and a junction region are sequentially formed, a SEG layer is formed and then a facet phenomenon of the SEG layer is used to form a LDD region, thus shallowly controlling the depth of the LDD region and the junction region and increasing the integration degree of the device.

In order to accomplish the above mentioned object, a method of manufacturing a semiconductor device is characterized in that it comprises the steps of forming a gate electrode consisted of a gate oxide film, a conductive layer and a first insulating film, thermal processing it under oxidization atmosphere, and forming a thermal oxide film on the upper portion of the gate oxide film and at the sidewalls of the conductive layer; forming a second insulating film on the entire structure and performing a blanket etching process to form a first insulating film spacer at the sidewalls of the gate electrode, and forming a third insulating film on the entire structure in which the first insulating film spacer is formed and performing a blanket etching process to form a second insulating film spacer at the sidewalls of the first insulating film spacer: performing a high concentration ion injection process using the gate electrode, the first insulating film spacer and the second insulating film spacer as a mask, thus forming a junction region; performing a cleaning process to remove the second insulating film spacer; performing a selective epitaxial growth method to form a selective epitaxial growth layer on the exposed semiconductor device; and performing a low concentration ion injection process to form a LDD region.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
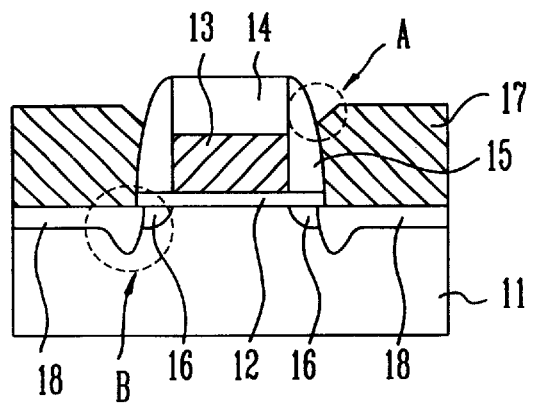
FIG. 1 is a sectional view of a device for illustrating a method of manufacturing a conventional semiconductor device.

The present invention will be described in detail by way of a preferred embodiment with reference to accompanying drawings in which like reference numerals are used to identify the same or similar parts.

FIGS. 2A through 2D are sectional views of a device for illustrating a method of manufacturing a semiconductor device according to the present invention.

Figure 2A:
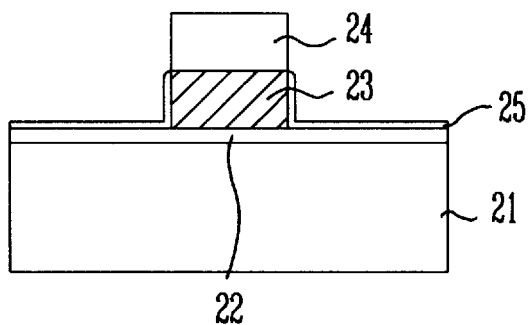
FIGS. 2A through 2D are sectional views of a device for illustrating a method of manufacturing a semiconductor device according to the present invention.

As shown in FIG. 2A, a semiconductor device 21 is thermally oxidized to form a gate oxide film 22. Then, a conductive layer 23 and a first insulating film 24 are sequentially formed on the entire structure. Next a portion in which a gate electrode will be formed is defined by photolithography process and etching process. Then, the first insulating film 24 and the conductive layer 23 are sequentially etched to form a gate electrode. At this time, the conductive layer 23 is formed using any one of multi-structures of doped silicon, amorphous silicon, metal and suicide. Next, it is experienced by a thermal process under oxidization atmosphere, thus forming a thermal oxide film 25 on the upper portion of the gate oxide film 22 and at the sidewalls of the conductive layer 23. The thermal oxide film 25 is formed 30 through 100 Angstrom in thickness.

Figure 2B:
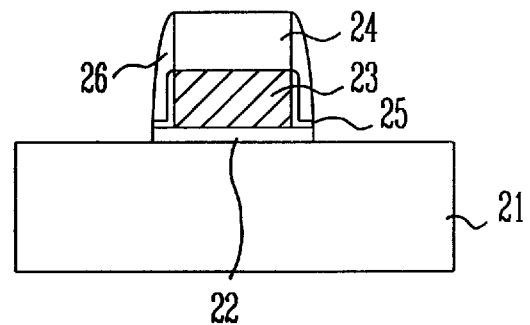

FIG. 2B shows a sectional view of the device in which a second insulating film is formed on the entire structure and a blanket etching process is performed thus forming a first insulating film spacer 26 at the side walls of the gate electrode. The first insulating film spacer 26 is formed 100 through 200 Angstrom in thickness using a CVD oxide film or a CVD nitride film.

Figure 2C:
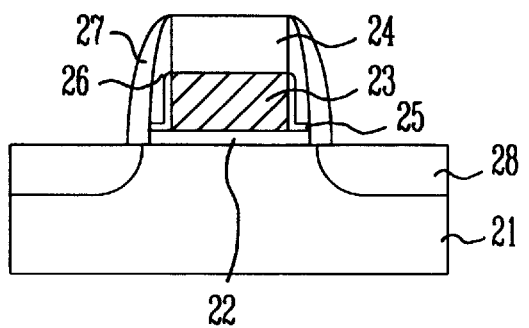

FIG. 2C shows a sectional view of the device in which a third insulating film is formed on the entire structure and a blanket etching process is performed, thus forming a second insulating film spacer 27 at the side walls of the first insulating film spacer 26. At this time as the third insulating film for forming the second insulating film spacer 27 is different in etching selective ratio to the second insulating film for the first insulating film spacer 26, it is usually formed of materials that can remove only the second insulating film spacer 27 without affecting the first insulating film spacer 26. For example, in case that the first insulating film spacer 26 is a CVD oxide films, the third insulating film is formed 300 through 800 Angstrom in thickness using materials that is removed by fluoric solution. However, in case that the first insulating film spacer 26 is a CVD nitride film, the third insulating film is formed using a CVD oxide film. After the second insulating film spacer 27 is formed, a high concentration ion injection process is performed to form a junction region (source/drain region 28).

Figure 2D:
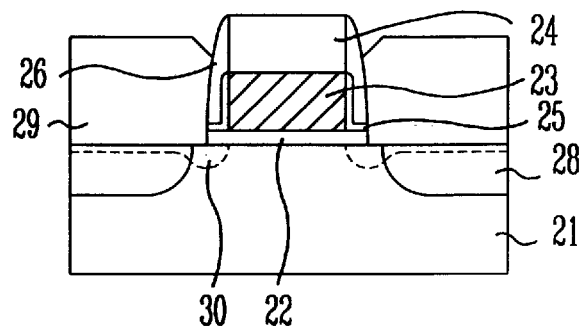

As shown in FIG. 2D, after a cleaning process using fluoric solution is performed to remove the second insulating film spacer 27 and a natural oxide film (not shown) of an active region, a SEG layer 29 is formed by SEG process. The SEG layer 29 is formed 1000 through 1500 Angstrom in thickness. Then, a low concentration ion injection process is performed to form a LDD region 30. The energy of the ion injection process for forming the LDD region 30 is controlled so that it can inject ions much deeper than the facet occurred at the SEG layer 29. In order to reduce the resistance of the metal contact formed in a subsequent process after the formation of LDD region 30, a process of injecting ions of a high concentration (for example, ion concentration of $10^{15}$) with a low energy may be included so as to lower the resistance of the SEG layer.

As described above in case of forming an elevated junction region using a selective epitaxial growth (SEG) method, the present invention uses a facet phenomenon occurring at the edge portion of the gate electrode to form a junction region of a very shallow depth. Thus, it can obtain a semiconductor device having its integration level increased and its short channel effect prohibited.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a semiconductor device, comprising the steps of:

forming a gate electrode consisted of a gate oxide film, a conductive layer and a first insulating film, thermal processing it under oxidization atmosphere, and forming a thermal oxide film on the upper portion of the gate oxide film and at the sidewalls of the conductive layer;

forming a second insulating film on the entire structure and performing a blanket etching process to form a first insulating film spacer at the sidewalls of the gate electrode and forming a third insulating film on the entire structure in which the first insulating film spacer is formed and performing a blanket etching process to form a second insulating film spacer at the sidewalls of the first insulating film spacer;

performing a high concentration ion injection process using the gate electrode. the first insulating film spacer and the second insulating film spacer as a mask, thus forming a junction region;

performing a cleaning process to remove the second insulating film spacer;

performing a selective epitaxial growth method to form a selective epitaxial growth layer on the exposed semiconductor device; and performing a low concentration ion injection process to form a LDD region.

2. The method of manufacturing a semiconductor device according to claim 1, wherein said conductive layer is formed using any one of multi-structure of doped polysilicon, amorphous silicon, metal and silicide.

3. The method of manufacturing a semiconductor device according to claim 1, wherein said thermal oxide film is formed 30 through 100 Angstrom in thickness.

4. The method of manufacturing a semiconductor device according to claim 1, wherein said first insulating film spacer is formed using a CVD oxide film or a CVD nitride film.

5. The method of manufacturing a semiconductor device according to claim 1, wherein said first insulating film spacer is formed 100 through 200 Angstrom in thickness.

6. The method of manufacturing a semiconductor device according to claim 1, wherein said second insulating film spacer is formed using materials that can remove only the second insulating film spacer without affecting the first insulating film spacer upon etching process.

7. The method of manufacturing a semiconductor device according to claim 1, wherein said second insulating film spacer is formed using materials that can be removed by fluoric solution.

8. The method of manufacturing a semiconductor device according to claim 1, wherein said second insulating film spacer is formed 300 through 800 Angstrom in thickness.

9. The method of manufacturing a semiconductor device according to claim 1, wherein said cleaning process is performed using fluoric solution.

10. The method of manufacturing a semiconductor device according to claim 1, wherein said selective epitaxial growth layer is formed 1000 through 1500 Angstrom in thickness.

11. The method of manufacturing a semiconductor device according to claim 1, further including the step of performing a high concentration ion injection process using a low energy after formation of said LDD region.

12. The method of manufacturing a semiconductor device according to claim 11, wherein said high concentration ion injection process is performed with ion concentration of $10^{15}$.

* * * * *